(12) United States Patent
Chang et al.

(10) Patent No.: US 8,217,819 B2
(45) Date of Patent: Jul. 10, 2012

(54) MULTIPLYING DAC AND A METHOD THEREOF

(75) Inventors: Soon-Jyh Chang, Tainan (TW); Jin-Fu Lin, Tainan (TW)

(73) Assignees: Himax Technologies Limited, Tainan County (TW); NCKU Research and Development Foundation, Tainan County (TW)

( * ) Notice: Subject to any disclaimer, the term of this patent is extended or adjusted under 35 U.S.C. 154(b) by 100 days.

(21) Appl. No.: 12/941,510

(22) Filed: Nov. 8, 2010

(65) Prior Publication Data
US 2012/0112944 A1    May 10, 2012

(51) Int. Cl.
*H03M 1/66* (2006.01)
(52) U.S. Cl. ......... 341/150; 341/144; 341/161; 341/162
(58) Field of Classification Search .................. 341/144, 341/150, 161, 162
See application file for complete search history.

(56) References Cited

U.S. PATENT DOCUMENTS

| | | | | |
|---|---|---|---|---|
| 6,441,765 B1 * | 8/2002 | Aram | ............................ | 341/155 |
| 6,836,236 B2 * | 12/2004 | Horie | ............................ | 341/155 |
| 7,429,946 B2 * | 9/2008 | Huang | ........................... | 341/172 |
| 7,649,488 B1 * | 1/2010 | Johansson | ..................... | 341/163 |

* cited by examiner

*Primary Examiner* — Khai M Nguyen
(74) *Attorney, Agent, or Firm* — Muncy, Geissler, Olds & Lowe, PLLC

(57) ABSTRACT

The present invention is directed to a multiplying digital-to-analog converter (MDAC) and its method. First ends of capacitors are electrically coupled to an inverting input node of an amplifier, wherein two of the capacitors are alternatively configured as a feedback capacitor. Each capacitor is composed of at least two sub-capacitors. Second ends of capacitors are electrically coupled to an input signal via a number of sampling switches, and the second ends of the capacitors are electrically coupled to DAC voltages respectively via a number of amplifying switches. A sorting circuit is configured to sort the sub-capacitors, wherein the sorted sub-capacitors are then paired in a manner such that variance of mismatch among the sub-capacitors is thus averaged.

16 Claims, 4 Drawing Sheets

MULTIPLYING DAC AND A METHOD THEREOF

BACKGROUND OF THE INVENTION

1. Field of the Invention

The present invention generally relates to a pipelined analog-to-digital converter (ADC), and more particularly to a conditional capacitor averaging circuit and method for reducing nonlinearity induced by capacitor mismatch in the pipelined ADC.

2. Description of Related Art

The accuracy of a pipelined analog-to-digital converter (ADC) is mainly limited by capacitor mismatch due to the fact that the fabricated capacitor accuracy is commonly limited to 10-11 bit level. Some techniques are disclosed to reduce nonlinearity, e.g., differential nonlinearity (DNL) and integral nonlinearity (INL), induced by the capacitor mismatch. However, the conventional techniques either cannot effectively improve the nonlinearity or cannot be adapted to various kinds of ADCs. For example, most of the conventional techniques are only suitable for 1-bit or 1.5-bit/stage architectures, but not the 2.5-bit/stage architecture that is demonstrated as one of the most power-efficient architectures.

Although some techniques have been disclosed that can be applied for architectures with any stage resolutions, those techniques, however, require sophisticated circuit or complex switching networks.

For the foregoing reasons, a need has arisen to propose a novel scheme for reducing the error effect induced by capacitor mismatch, particularly in 2.5-bit/stage high-resolution pipelined ADCs, to achieve more power-efficient conversion while maintaining sufficient static and dynamic performances.

SUMMARY OF THE INVENTION

In view of the foregoing, it is an object of the embodiment of the present invention to provide a multiplying digital-to-analog converter (MDAC) and method that combine a component sorting technique with capacitor averaging technique to enhance the linearity of a pipelined ADC without complex switch network. Furthermore, DAC voltages for a stage circuit of the pipelined ADC may be properly arranged to further reduce a gain error of the DAC voltages.

According to one embodiment, the multiplying digital-to-analog converter (MDAC) includes an amplifier, a number of capacitors, a number of sampling switchers and amplifying switches, and a sorting circuit. The amplifier has an inverting input node, a non-inverting input node and an output node providing an output signal. First ends of the capacitors are electrically coupled to the inverting input node, wherein two of the capacitors are alternatively configured as a feedback capacitor across the inverting input node and the output node. Each capacitor is composed of at least two sub-capacitors. Second ends of the capacitors are electrically coupled to an input signal via the sampling switches, which are closed during a sampling period. The second ends of the capacitors are electrically coupled to DAC voltages respectively via the amplifying switches. The sorting circuit is configured to sort the sub-capacitors, wherein the sorted sub-capacitors are then paired in a manner such that variance of mismatch among the sub-capacitors is thus averaged.

According to another embodiment, a number of sub-capacitors are first sorted, thereby resulting in first sorted sub-capacitors. At least any two of the first sorted sub-capacitors are paired in a manner such that variance of mismatch among the sub-capacitors is averaged, thereby resulting in paired capacitors. The pair capacitors are second sorted, thereby resulting in second sorted capacitors, wherein the second sorted capacitors with a smallest capacitor value and a largest capacitor value are assigned as a first and a second feedback capacitors of an amplifier during a first-phase amplifying period and a second-phase amplifying period respectively. In a sampling period, an input signal is sampled by the second sorted capacitors. In the entire amplifying period, the first and the second feedback capacitors are electrically coupled to receive a first one of DAC voltages when the first or the second feedback capacitor does not act as the feedback capacitor. In the entire amplifying period, the second sorted capacitors excluding the first and the second feedback capacitors are electrically coupled to receive the DAC voltages excluding the first DAC voltage respectively.

DETAILED DESCRIPTION OF THE INVENTION

Figure 1A:
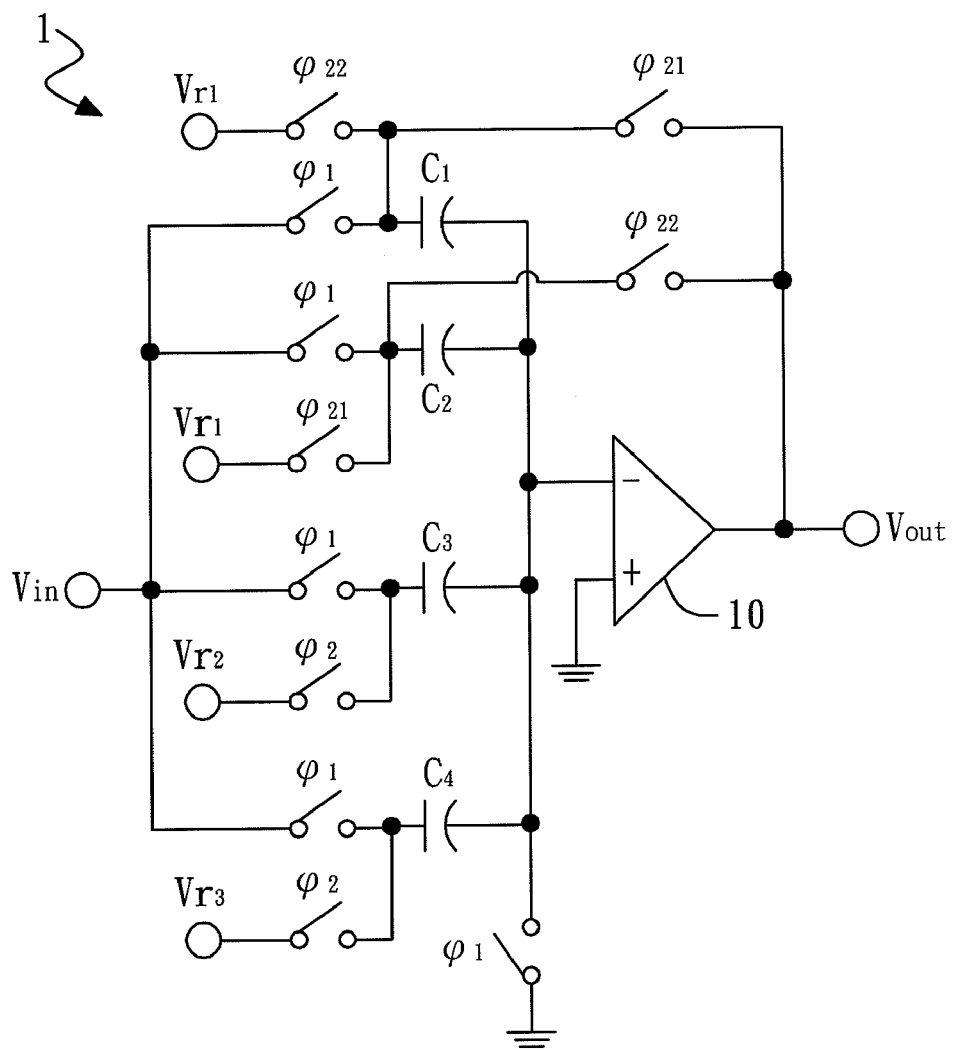
FIG. 1A schematically shows a circuit diagram that illustrates a multiplying digital-to-analog converter (MDAC) according to one embodiment of the present invention.

FIG. 1A schematically shows a circuit diagram that illustrates a multiplying digital-to-analog converter (MDAC) 1 according to one embodiment of the present invention. The MDAC 1 is adaptable to a stage circuit of a pipelined analog-to-digital converter (ADC). Although a 2.5-bit/stage pipelined ADC is demonstrated, it is appreciated by those skilled in the art that the illustrated MDAC 1 may be adapted to other pipelined ADC such as a 3.5-bit/stage pipelined ADC.

Figure 1B:
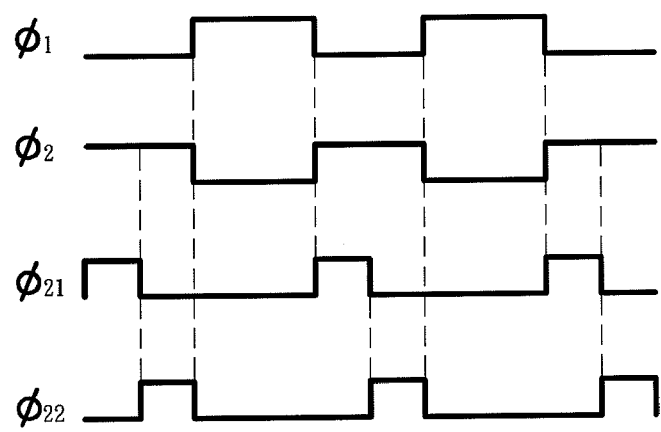
FIG. 1B shows waveforms representing a sampling period $\phi_1$ and amplifying periods $\phi_2$, $\phi_{21}$ and $\phi_{22}$.

In the embodiment, the MDAC 1 is implemented by a switched-capacitor (SC) circuit as shown. Specifically, first ends of (first/second/third/fourth) capacitors $C_1$, $C_2$, $C_3$ and $C_4$ are electrically coupled to an inverting input node of an amplifier 10 such as an operational amplifier or op-amp with its non-inverting output node grounded. Second ends of the capacitors $C_1$, $C_2$, $C_3$ and $C_4$ are electrically coupled to an input signal $V_{in}$ via a number of sampling switches $\phi_1$, which are closed during a sampling period $\phi_1$. The second ends of the capacitors $C_1$, $C_2$, $C_3$ and $C_4$ are further electrically coupled to (first/second/third) DAC voltages $V_{r1}$, $V_{r2}$ and $V_{r3}$ via a number of amplifying switches $\phi_2$, $\phi_{21}$ and $\phi_{22}$ respectively, which are closed during amplifying period $\phi_2$, $\phi_{21}$ and $\phi_{22}$, where $\phi_2$ represents an entire amplifying period or an entire amplifying switch that is closed during the entire amplifying period, $\phi_{21}$ represents a firs-phase amplifying period or a first-phase amplifying switch, and $\phi_{22}$ represents a second-phase amplifying period or a second-phase amplifying switch. FIG. 1B shows waveforms representing the sampling period $\phi_1$ and the amplifying periods $\phi_2$, $\phi_{21}$ and $\phi_{22}$. In the embodiment, the first-phase amplifying period $\phi_{21}$ and the second-phase amplifying period $\phi_{22}$ are mutually exclusive, and constitute the entire amplifying period $\phi_2$. Moreover, the second ends of the capacitors $C_1$ and $C_2$ are electrically coupled to an output signal or an output node $V_{out}$ of the amplifier 10 via the (first/second-phase) amplifying switches $\phi_{21}$ and $\phi_{22}$ respectively.

According to the configuration described above, in the sampling period $\phi_1$, all capacitors $C_1$-$C_4$ sample the input signal $V_{in}$. In the first-phase amplifying period $\phi_{21}$, the capacitor $C_1$ is flipped to the output node $V_{out}$ of the amplifier 10 as a feedback capacitor; in the second-phase amplifying period $\phi_{22}$, the capacitor $C_2$ is flipped to the output node $V_{out}$ of the amplifier 10 as the feedback capacitor. In other words, the capacitor $C_1$ and $C_2$ are alternatively configured as the feedback capacitor in the first-phase amplifying period $\phi_{21}$ and the second-phase amplifying period $\phi_{22}$ respectively. In the first-phase amplifying period $\phi 21$, the capacitor $C_2$ is electrically coupled to the DAC voltage $V_{r1}$; in the second-phase amplifying period $\phi_{22}$, the capacitor $C_1$ is electrically coupled to the DAC voltage $V_{r1}$; in the amplifying period $\phi_2$, other capacitors $C_3$-$C_4$ are electrically coupled to the other DAC voltages $V_{r2}$-$V_{r3}$.

Figure 1C:
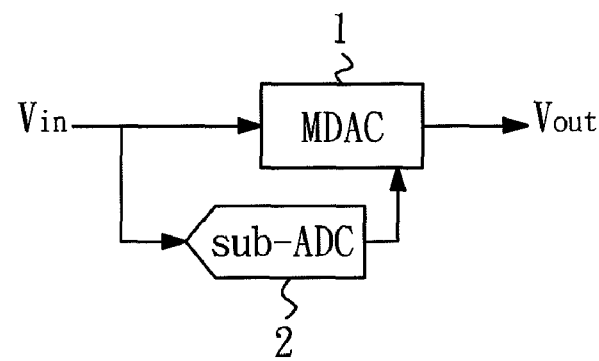
FIG. 1C shows a block diagram of the MDAC of FIG. 1A accompanying an ADC.

Based on the charge conservation at the inverting input node of the amplifier 10, a first output signal $V_{out1}$ using the capacitor $C_1$ as the feedback and a second output signal $V_{out2}$ using the capacitor $C_2$ as the feedback may be derived as follows:

$$V_{out1} = \frac{C_1+C_2+C_3+C_4}{C_1}V_{in} + \frac{C_2}{C_1}V_{r1} + \frac{C_3}{C_1}V_{r2} + \frac{C_4}{C_1}V_{r3}$$

$$V_{out2} = \frac{C_1+C_2+C_3+C_4}{C_2}V_{in} + \frac{C_1}{C_2}V_{r1} + \frac{C_3}{C_2}V_{r2} + \frac{C_4}{C_2}V_{r3}$$

where the DAC voltages $V_{r1}$, $V_{r2}$ and $V_{r3}$ are $\{\pm V_{ref}, 0\}$, which depend on conversion results of a sub-analog-to-digital converter (sub-ADC) 2 that receives the input signal $V_{in}$ as shown in FIG. 1C; $V_{ref}$ is a reference voltage of the pipelined ADC.

Figure 1D:
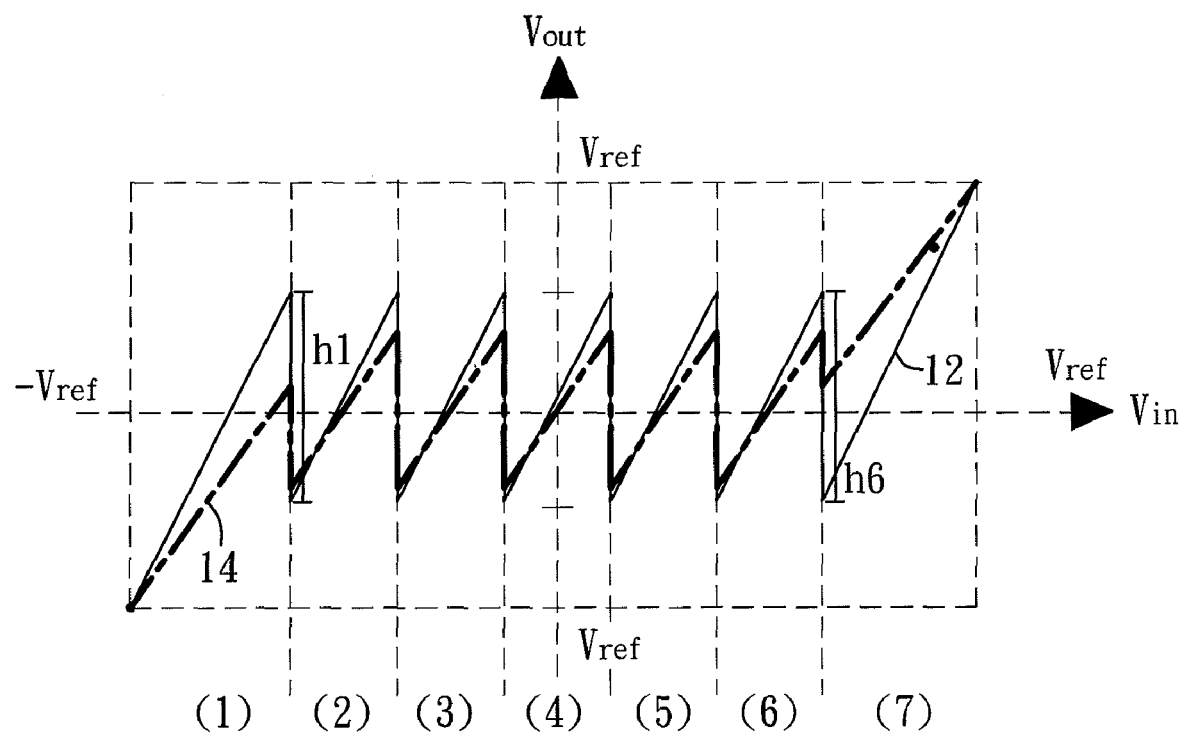
FIG. 1D shows an ideal transfer curve and a non-ideal transfer curve of the stage circuit of the pipelined ADC.

FIG. 1D shows an ideal transfer curve 12 of the stage circuit of the pipelined ADC when all capacitors $C_1$-$C_4$ are matched each other. The transfer curve 12 includes seven segments 1-7, and the stage gain and total DAC voltages of these segments are 4 and $\{3V_{ref}, 2V_{ref}, V_{ref}, 0, -V_{ref}, 2V_{ref}, 3V_{ref}\}$, respectively. It is noteworthy that the values of the DAC voltages $V_{r1}$, $V_{r2}$ and $V_{r3}$ may have many possible combinations to satisfy the corresponding transfer function of each segment.

FIG. 1D also shows a non-ideal transfer curve 14 of the stage circuit of the pipelined ADC when the capacitors $C_1$-$C_4$ mismatch. The transition heights between two segments $h_1$-$h_6$ and curve slope of each segment commonly deviate from the ideal curve 12. It is observed in FIG. 1D that every segment has the same stage gain error but usually has different errors of the DAC voltages $V_{r1}$, $V_{r2}$ and $V_{r3}$.

Regarding mismatch among the capacitors $C_1$-$C_4$, assume $C_x = C(1+\Delta_x)$, x=1-4 and $\Delta_x \ll 1$, an averaging output signal $V_{out\_avg}$ is given by $$V_{out\_avg} = \frac{V_{out1}+V_{out2}}{2}$$
$$\approx (4+\Delta_3+\Delta_4-\Delta_1-\Delta_2)V_{in} +$$
$$V_{r1} + (1+\Delta_3-0.5(\Delta_1+\Delta_2))V_{r2} +$$
$$(1+\Delta_4-0.5(\Delta_1+\Delta_2))V_{r3}$$

It is noted that the first order error term of $V_{r1}$ is averaged. To reduce the integral nonlinearity (INL) of the pipelined ADC, the term of $(\Delta_3+\Delta_4-\Delta_1-\Delta_2)$ in the stage gain should be reduced as far as possible. Moreover, the terms of $(\Delta_3-0.5(\Delta_1+\Delta_2))$ and $(\Delta_4-0.5(\Delta_1+\Delta_2))$ in the DAC voltages should be reduced to achieve small differential nonlinearity (DNL).

Figure 2A:
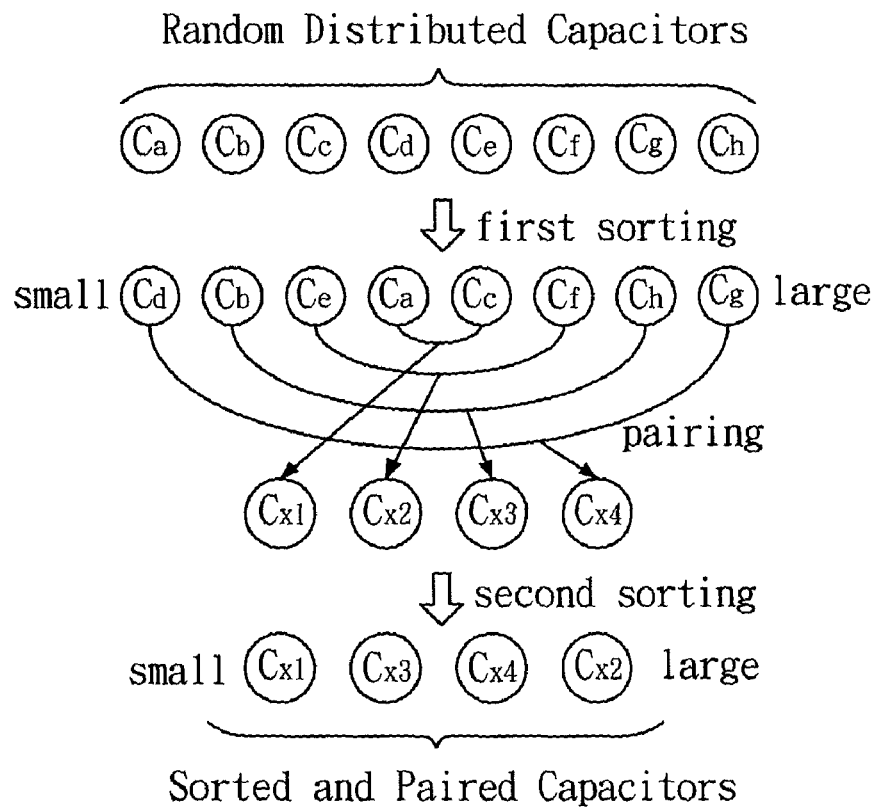
FIG. 2A shows an exemplary flow of reducing the random variance of capacitor mismatch according to the embodiment of the present invention.

FIG. 2A shows an exemplary flow of reducing the random variance of capacitor mismatch according to the embodiment of the present invention. Specifically, eight (first to eighth) sub-capacitors $C_a$-$C_h$ are used to compose the four capacitors $C_1$-$C_4$ in FIG. 1A. That is, each one of the capacitors $C_1$-$C_4$ is composed of two of the sub-capacitors $C_a$-$C_h$. It is appreciated that, in another embodiment, more than two sub-capacitors may be used to compose each of the capacitors $C_1$-$C_4$.

The sub-capacitors $C_a$-$C_h$ are then first sorted by the order of their capacitor values. For example, as shown in FIG. 2A, the sub-capacitor $C_d$ is the smallest one and the sub-capacitor $C_g$ is the largest one after the first sorting.

Subsequently, any two of the sub-capacitors are paired, thereby resulting in four paired capacitors $C_{x1}$-$C_{x4}$. In the embodiment, the two sub-capacitors are paired from the middle capacitors to outliers. In other words, the sub-capacitor with the largest capacitor value is paired with the sub-capacitor with the smallest capacitor value; the sub-capacitor with the next largest capacitor value is paired with the sub-capacitor with the next smallest capacitor value; and so on. As a result, large variance of capacitor mismatch is averaged by the first sorting and the pairing process.

Afterwards, the paired capacitors $C_{x1}$-$C_{x4}$ are second sorted. The second sorted capacitors are used as the capacitors $C_1$-$C_4$ in FIG. 1A. In the embodiment, the second sorted capacitors with the largest and the smallest capacitor values are assigned as $C_1$ and $C_2$, and other capacitors, i.e., the middle capacitors, are assigned as $C_3$ and $C_4$, As a result, the term of $(\Delta_3+\Delta_4-\Delta_1-\Delta_2)$ in the stage gain can be reduced. Moreover, this capacitor arrangement can also reduce error terms of the DAC voltages, i.e., $(\Delta_3-0.5(\Delta_1+\Delta_2))$ and $(\Delta_4-0.5(\Delta_1+\Delta_2))$.

Figure 2B:
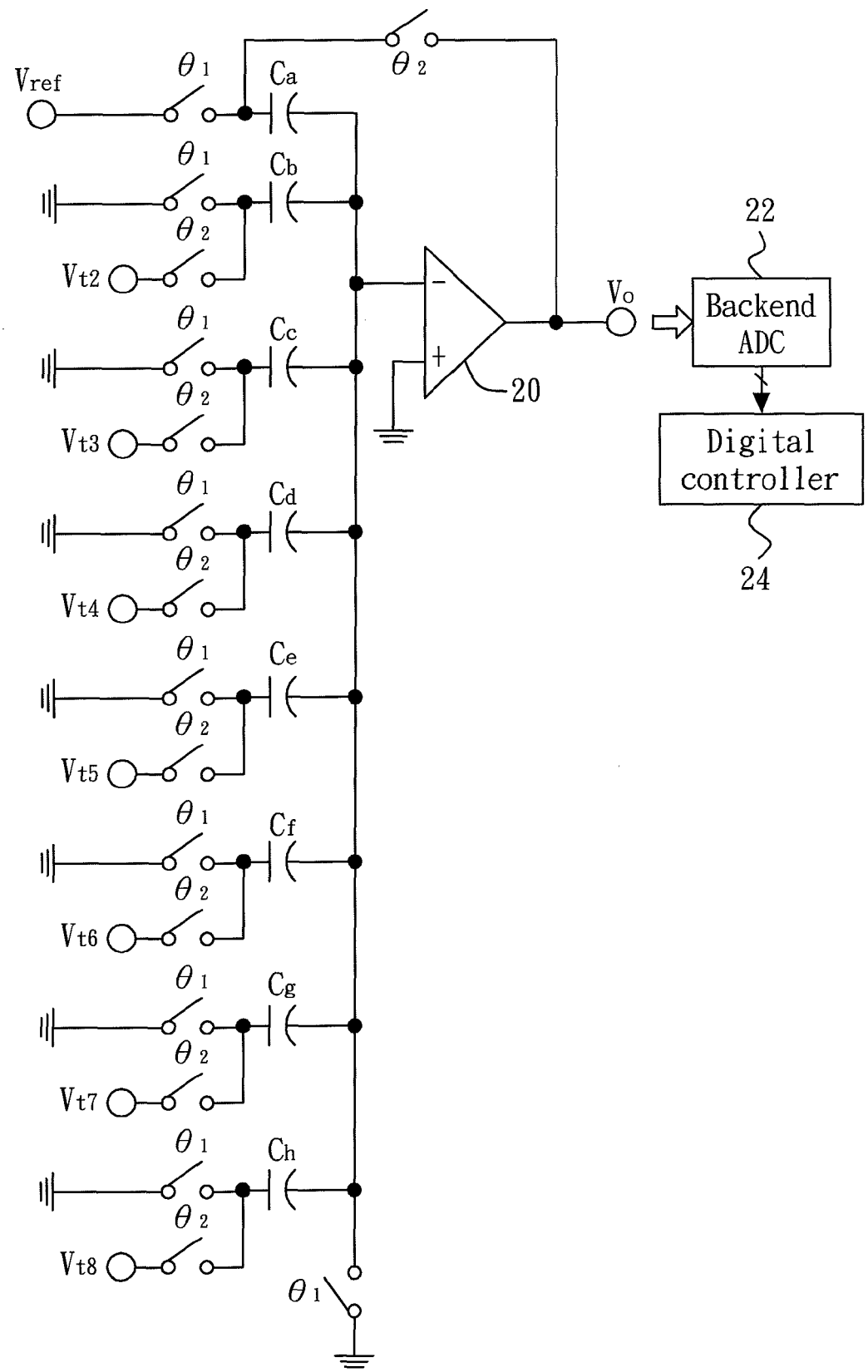
FIG. 2B schematically shows a sorting circuit for performing sorting demonstrated in FIG. 2A according to the embodiment of the present invention.

FIG. 2B schematically shows a sorting circuit for performing sorting demonstrated in FIG. 2A according to the embodiment of the present invention. In the embodiment, the sorting circuit is implemented by a switched-capacitor (SC) circuit as shown. Specifically, first ends of (first to eighth) sub-capacitors $C_a$-$C_h$ are electrically coupled to an inverting input node of a sorting amplifier 20 such as an operational amplifier or op-amp with its non-inverting output node grounded. It is noted that the sorting amplifier 20 may be realized by the same amplifier 10 in FIG. 1A. A second end of the sub-capacitor $C_a$ (which acts as a basis sub-capacitor) is electrically coupled to the reference voltage $V_{ref}$ via a first switch $\theta_1$, and is also electrically coupled to an output node $V_o$ of the sorting amplifier 20 via a second switch $\theta_2$, where the first switch $\theta_1$ and the second switch $\theta_2$ are closed exclusively mutually. First and second ends of the other sub-capacitors $C_b$-$C_h$ are grounded via a number of the first switches $\theta_1$ (i.e., reset the other sub-capacitors $C_b$-$C_h$), and second ends of the other sub-capacitors $C_b$-$C_h$ are also electrically coupled to test signals $V_{t2}$-$V_{t8}$ respectively via a number of the second switches $\theta_2$.

According to the configuration described above, in a first period $\theta_1$, only the sub-capacitor $C_a$ samples the reference voltage $V_{ref}$, and other sub-capacitors $C_b$-$C_h$ are reset or grounded. In a second period $\theta_2$ that is mutually exclusive with the first period $\theta_1$, the sub-capacitor $C_a$ is flipped to the output node $V_o$ as a feedback capacitor and other sub-capacitors $C_b$-$C_h$ are electrically coupled to their corresponding test signals $V_{t2}$-$V_{t8}$, which are $\{V_{ref}, 0\}$. By sequentially assigning the test signals $V_{t2}$-$V_{t8}$, the digital code of each capacitor $C_b$-$C_h$ relative to $C_a$ may be obtained by a backend ADC 22. For example, at first, the test signal $V_{t2}$ is assigned as $V_{ref}$ and other test signals $V_{t3}$-$V_{t8}$ are assigned as 0 (i.e., ground voltage) for obtaining the digital code of capacitor $C_b$ relative to $C_a$. Then, the test signal $V_{t3}$ is assigned as $V_{ref}$ and other test signals $V_{t2}$, $V_{t4}$-$V_{t8}$ are assigned as 0 for obtaining the digital code of capacitor $C_c$ relative to $C_a$. In the same way, the corresponding digital code of each capacitor relative to $C_a$ is obtained sequentially. The obtained digital codes are then forwarded to a digital controller 24 to perform the sorting. In a further embodiment, repeated measurements of the digital codes corresponding to each capacitor may be performed and averaged in order to reduce noise disturbance. Generally speaking, when N sub-capacitors are sorted, only N comparison processes may be performed. The sorting output signal may be given by $$V_o = V_{ref} - \sum_{i=b}^{N} \frac{C_i}{C_a} V_{ti}$$

According to another aspect of the present invention, the DAC voltages $V_{r1}$-$V_{r3}$ may be specifically arranged to further reduce the gain error the DAC voltages. Table 1 shows the DAC voltage arrangement according to a preferred embodiment of the present invention. As the DAC voltage $V_{r1}$ has almost no error effect of the capacitor mismatch, non-zero values±$V_{ref}$ are thus arranged to the DAC voltage $V_{r1}$. Because $V_{r2}$ and $V_{r3}$ are all zero in segments 3, 4 and 5, these segments have no gain error for the DAC voltages with the help of this arrangement. Furthermore, segments 2 and 6 only have ($\Delta_3$−0.5($\Delta_1$+$\Delta_2$)) error term, and segments 1 and 7 have ($\Delta_3$+$\Delta_4$−$\Delta_1$−$\Delta_2$) error term. Accordingly, the above-mentioned sorting capacitor arrangement can both reduce errors of stage gain and DAC voltages and thus improve the INL and DNL values. In addition, because dynamic specifications, such as signal-to-noise and distortion (SNDR) and spurious free dynamic range (SFDR), are strongly proportional to static specifications, such as INL and DNL, the embodiment of the present invention can also improve SNDR and SFDR of 2.5-bit/stage pipelined ADCs. It is worthy to note that the ground voltage mentioned in above description is considered as a common voltage for clearly description. In practice, the ground voltage may be replaced by any suitable voltage. Although the embodiments mentioned above are implemented in single-end type, the MDAC 1, FIG. 1A, and sorting circuit, FIG. 2B, may be implemented in differential type for another enbodiment.

TABLE 1

| Segment | 1 | 2 | 3 | 4 | 5 | 6 | 7 |
|---|---|---|---|---|---|---|---|
| $V_{r1}$ | $V_{ref}$ | $V_{ref}$ | $V_{ref}$ | 0 | −$V_{ref}$ | −$V_{ref}$ | −$V_{ref}$ |
| $V_{r2}$ | $V_{ref}$ | $V_{ref}$ | 0 | 0 | 0 | −$V_{ref}$ | −$V_{ref}$ |
| $V_{r3}$ | $V_{ref}$ | 0 | 0 | 0 | 0 | 0 | −$V_{ref}$ |
| Total | 3$V_{ref}$ | 2$V_{ref}$ | $V_{ref}$ | 0 | −$V_{ref}$ | −2$V_{ref}$ | −3$V_{ref}$ |

Although specific embodiments have been illustrated and described, it will be appreciated by those skilled in the art that various modifications may be made without departing from the scope of the present invention, which is intended to be limited solely by the appended claims.

What is claimed is:

1. A multiplying digital-to-analog converter (MDAC), comprising:
    an amplifier having an inverting input node, a non-inverting input node and an output node providing an output signal;
    a plurality of capacitors, first ends of the plurality of capacitors being electrically coupled to the inverting input node, wherein two of the plurality of capacitors are alternatively configured as a feedback capacitor across the inverting input node and the output node, wherein each of the plurality of capacitors is composed of at least two sub-capacitors;
    a plurality of sampling switches, through which second ends of the plurality of capacitors are electrically coupled to an input signal, wherein the plurality of sampling switches are closed during a sampling period;
    a plurality of amplifying switches, through which the second ends of the plurality of capacitors are electrically coupled to a plurality of DAC voltages respectively; and
    a sorting circuit configured to sort the sub-capacitors, wherein the sorted sub-capacitors are then paired in a manner such that variance of mismatch among the sub-capacitors is thus averaged.

2. The MDAC of claim 1, wherein the plurality of amplifying switches comprise:
    at least one entire amplifying switch that is closed during an entire amplifying period;
    at least one first-phase amplifying switch that is closed during a first-phase amplifying period; and
    at least one second-phase amplifying switch that is closed during a second-phase amplifying period, which is mutually exclusive with the first-phase amplifying period.

3. The MDAC of claim 2, wherein said two capacitors are alternatively configured as the feedback capacitor during the first-phase amplifying period and the second-phase amplifying period respectively.

4. The MDAC of claim 1, further comprising a sub-analog-to-digital converter (sub-ADC) that receives the input signal and generates a result, based on which the DAC voltages are thus configured.

5. The MDAC of claim 1, wherein the sub-capacitor with a largest capacitor value is paired with the sub-capacitor with a smallest capacitor value, and the sub-capacitor with a next largest capacitor value is paired with the sub-capacitor with a next smallest capacitor value.

6. The MDAC of claim 1, wherein the paired capacitors are second sorted, and the second sorted capacitors with a largest capacitor value and a smallest capacitor value are configured as the feedback capacitor.

7. The MDAC of claim 1, wherein the sorting circuit comprises:
    a sorting amplifier having an inverting input node configured to electrically couple first ends of the sub-capacitors, wherein one of the sub-capacitors is selected as a basis sub-capacitor;
    a plurality of first switches, through which the basis sub-capacitor samples a reference voltage and the other sub-capacitors are reset during a first period; and
    a plurality of second switches, through which the basis sub-capacitor is configured as a feedback capacitor and second ends of the other sub-capacitors are electrically coupled to a plurality of test signals respectively during a second period, which is mutually exclusive with the first period.

8. The MDAC of claim 7, further comprising a digital controller configured to receive digital codes corresponding to the sub-capacitors from an output node of the sorting amplifier, and then perform sorting on the digital codes.

9. The MDAC of claim 1, wherein the sub-capacitors comprise eight sub-capacitors, and each said capacitor is composed of two said sub-capacitors, wherein the MDAC is adaptable to a 2.5-bit/stage pipelined ADC.

10. The MDAC of claim 9, wherein a transfer curve between the output signal and the input signal has seven segments 1-7, and the plurality of DAC voltages comprise three DAC voltages $V_{r1}$, $V_{r2}$ and $V_{r3}$, which are arranged as follows:

| Segment | 1 | 2 | 3 | 4 | 5 | 6 | 7 |
|---|---|---|---|---|---|---|---|
| $V_{r1}$ | $V_{ref}$ | $V_{ref}$ | $V_{ref}$ | 0 | $-V_{ref}$ | $-V_{ref}$ | $-V_{ref}$ |
| $V_{r2}$ | $V_{ref}$ | $V_{ref}$ | 0 | 0 | 0 | $-V_{ref}$ | $-V_{ref}$ |
| $V_{r3}$ | $V_{ref}$ | 0 | 0 | 0 | 0 | 0 | $-V_{ref}$ |
| Total | $3V_{ref}$ | $2V_{ref}$ | $V_{ref}$ | 0 | $-V_{ref}$ | $-2V_{ref}$ | $-3V_{ref}$ | wherein $V_{ref}$ is a reference voltage of the pipelined ADC.

11. A digital-to-analog conversion method, comprising:
providing a plurality of sub-capacitors;
first sorting the plurality of sub-capacitors, thereby resulting in a plurality of first sorted sub-capacitors;
pairing at least any two of the first sorted sub-capacitors in a manner such that variance of mismatch among the sub-capacitors is averaged, thereby resulting in a plurality of paired capacitors;
second sorting the pair capacitors, thereby resulting in a plurality of second sorted capacitors, wherein the second sorted capacitors with a smallest capacitor value and a largest capacitor value are assigned as a first and a second feedback capacitors of an amplifier during a first-phase amplifying period and a second-phase amplifying period respectively, wherein the first-phase amplifying period and the second-phase amplifying period are mutually exclusive and constitute an entire amplifying period;
in a sampling period, sampling an input signal by the plurality of second sorted capacitors;
in the entire amplifying period, electrically coupling the first and the second feedback capacitors to receive a first one of a plurality of DAC voltages when the first or the second feedback capacitor does not act as the feedback capacitor; and
in the entire amplifying period, electrically coupling the second sorted capacitors excluding the first and the second feedback capacitors to receive the DAC voltages excluding the first DAC voltage respectively.

12. The method of claim 11, wherein the sub-capacitor with a largest capacitor value is paired with the sub-capacitor with a smallest capacitor value, and the sub-capacitor with a next largest capacitor value is paired with the sub-capacitor with a next smallest capacitor value.

13. The method of claim 11, further comprising:
performing sub-analog-to-digital conversion on the input signal and generating a result, based on which the DAC voltages are thus configured.

14. The method of claim 11, wherein the first sorting step comprises:
in a first period, sampling a reference voltage by a first one of the sub-capacitors, while resetting others of the sub-capacitors; and
in a second period that is mutually exclusively with the first period, configuring the first sub-capacitor as a feedback sub-capacitor, while coupling the sub-capacitors excluding the first sub-capacitor to corresponding test signals, thereby obtaining corresponding digital codes sequentially.

15. The method of claim 11, the sub-capacitors comprise eight sub-capacitors, and each said capacitor is composed of two said sub-capacitors, wherein the method is adaptable to a 2.5-bit/stage pipelined ADC.

16. The method of claim 15, wherein a transfer curve between an output signal and the input signal has seven segments 1-7, and the plurality of DAC voltages comprise three DAC voltages $V_{r1}$, $V_{r2}$ and $V_{r3}$, which are arranged as follows:

| Segment | 1 | 2 | 3 | 4 | 5 | 6 | 7 |
|---|---|---|---|---|---|---|---|
| $V_{r1}$ | $V_{ref}$ | $V_{ref}$ | $V_{ref}$ | 0 | $-V_{ref}$ | $-V_{ref}$ | $-V_{ref}$ |
| $V_{r2}$ | $V_{ref}$ | $V_{ref}$ | 0 | 0 | 0 | $-V_{ref}$ | $-V_{ref}$ |
| $V_{r3}$ | $V_{ref}$ | 0 | 0 | 0 | 0 | 0 | $-V_{ref}$ |
| Total | $3V_{ref}$ | $2V_{ref}$ | $V_{ref}$ | 0 | $-V_{ref}$ | $-2V_{ref}$ | $-3V_{ref}$ | wherein $V_{ref}$ is a reference voltage of the pipelined ADC.

* * * * *